United States Patent [19]

Ieki et al.

[11] Patent Number: 5,061,870
[45] Date of Patent: Oct. 29, 1991

[54] SURFACE ACOUSTIC WAVE DEVICE

[75] Inventors: Hideharu Ieki; Atsushi Sakurai; Koji Kimura, all of Kyoto, Japan

[73] Assignee: Murata Mfg. Co., Ltd., Japan

[21] Appl. No.: 549,214

[22] Filed: Jul. 6, 1990

[30] Foreign Application Priority Data

Jul. 6, 1989 [JP] Japan ................... 1-174763

[51] Int. Cl.$^5$ ........................................ H01L 41/08
[52] U.S. Cl. .......................... 310/313 A; 310/313 R; 310/363; 333/193
[58] Field of Search .............. 310/313 A, 313 R, 363, 310/364; 333/150, 193

[56] References Cited

U.S. PATENT DOCUMENTS

| | | | |
|---|---|---|---|
| 4,449,107 | 5/1984 | Asai et al. | 333/150 |
| 4,511,816 | 4/1985 | Mikoshiba et al. | 310/313 A |
| 4,567,393 | 1/1986 | Asai et al. | 310/313 A |
| 4,775,814 | 10/1988 | Yuhara et al. | 310/364 |
| 4,935,658 | 6/1990 | EerNisse et al. | 310/348 |
| 4,942,327 | 7/1990 | Watanabe et al. | 310/364 |
| 4,968,954 | 11/1990 | Ryuo et al. | 333/193 |

FOREIGN PATENT DOCUMENTS

| | | | |
|---|---|---|---|
| 0246626 | 11/1987 | European Pat. Off. | |
| 0048820 | 3/1982 | Japan | 310/313 R |
| 0046108 | 3/1985 | Japan | 310/313 R |
| 0092022 | 5/1986 | Japan | 333/193 |
| 0314906 | 12/1988 | Japan | 333/193 |
| 2181917 | 4/1987 | United Kingdom | |

OTHER PUBLICATIONS

"High Freq. and Low-Dispersion SAW Devices on AlN/Al$_2$O$_3$ and AlN/Si for Sig. Proc.", Conf. 1980, Ultrasonics Symposium, Boston, Mass., Nov. 5–7, 1980.
"ZnO Thin-Film SAW Devices for High Freq. Range", 10–79 National Technical Report, vol. 25, No. 5.

Primary Examiner—Mark O. Budd
Assistant Examiner—Thomas M. Dougherty
Attorney, Agent, or Firm—Ostrolenk, Faber, Gerb & Soffen

[57] ABSTRACT

A surface accoustic wave device includes a substrate which is made up of single-crystalline dielectric member and a piezoelectric thin film epitaxially grown thereon. An aluminum electrode defining an interdigital electrode is formed along the interface between the dielectric member and the piezoelectric thin film. This aluminum electrode is formed of an aluminum film which is crystallographically oriented in a constant direction, whereby stressmigration of the aluminum electrode is suppressed, while enabling epitaxial growth of the piezoelectric thin film over the entire surface insert.

6 Claims, 2 Drawing Sheets 5,061,870

SURFACE ACOUSTIC WAVE DEVICE

BACKGROUND OF THE INVENTION

1. Field of the Invention

The present invention relates to a surface acoustic wave device, and more particularly, it relates to a surface acoustic wave device using a piezoelectric thin film for forming a piezoelectric substrate.

2. Description of the Background Art

In recent years, surface acoustic wave devices such as a filter, a resonator or an oscillator using surface acoustic waves, which may hereinafter be referred to as SAW, have been widely employed.

The surface acoustic wave device is more suitable for high frequency as compared with a bulk wave device. The fundamental frequency of the surface waves generated in the surface acoustic wave device depends on the pitch of the interdigital electrodes and the propagation velocity of the surface acoustic wave (SAW velocity). In order to further increase the frequency in such a surface acoustic wave device, therefore, it is necessary to reduce the pitch of the interdigital electrodes or to employ a substrate having a high SAW velocity.

However, the possible pitch reduction of the interdigital electrodes is limited, so a high SAW velocity substrate must be used in order to further increase the frequency beyond the limit.

There has been developed a high SAW velocity substrate which comprises a single-crystalline dielectric member of silicon, sapphire or diamond and a piezoelectric thin film of zinc oxide or aluminum nitride provided thereon. Such a piezoelectric thin film must be epitaxially grown in order to reduce propagation loss in a high-frequency region.

On the other hand, aluminum is mainly used as a metal for forming the interdigital electrodes. Aluminum is thus employed for the reasons that it is easy to photolithograph, its specific gravity is so small as to provide a small electrode mass-loading effect, it has high conductivity, and the like. An aluminum film, which is generally formed by electron beam deposition (vapor deposition), sputtering or the like for defining the interdigital electrodes, is a crystallographically random-oriented polycrystalline film.

It is impossible to grow a piezoelectric thin film epitaxially on such an aluminum film, which is a random-oriented polycrystalline film. In a conventional surface acoustic wave device 10 shown in FIG. 4 using a high acoustic velocity substrate 13, therefore, a piezoelectric thin film 12 is first formed epitaxially on a single-crystalline dielectric member 11 by a method such as sputtering or CVD to obtain the high acoustic velocity substrate 13, and then aluminum electrodes 14 are formed on the surface of the piezoelectric thin film 12. In other words, the aluminum electrodes 14 are provided on the surface of the surface acoustic wave device 10 and exposed to the atmospheric air.

However, a piezoelectric thin film formed by a method such as sputtering or CVD can easily causes projections on its surface due to adhesion of dirt or the like. Therefore, it may not be possible to form smooth aluminum electrodes on the piezoelectric thin film. When photolithography is applied to an aluminum film for forming aluminum electrodes, projections may also be formed on the photoresist film to cause difficulty in giving intimate contact of a photomask with the surface of the photoresist film, which is provided on the aluminum film, because of such projections. If the projections formed on the piezoelectric thin film cause corresponding projections on the aluminum film, further, uniform application of the photoresist material may be prevented by such projections formed on the aluminum film. Thus, the aluminum electrodes formed in this way may be short-circuited.

Further, it has been recognized that, when a signal of a high voltage level is applied to a surface acoustic wave device such as an SAW filter or an SAW resonator, aluminum electrodes are subjected to strong stress by surface acoustic waves, which causes metal migration. This migration, which is caused by stress, is called stressmigration, to be distinguished from electromigration. Such stressmigration leads to electrical shorting and characteristic deterioration such as increase of insertion loss and reduction of the quality factor (Q) of the resonator. Occurrence of such stressmigration is facilitated as the frequency is increased, to cause a significant problem particularly in a surface acoustic wave device which is employed in a high-frequency region.

Although a small amount of Cu, Ti, Ni, Mg or Pd is added to an electrode material of aluminum as a countermeasure for preventing such stressmigration, sufficient improvement has not yet been attained.

SUMMARY OF THE INVENTION

The inventors have further investigated the cause for the aforementioned stressmigration. As described above, the aluminum film formed by electron beam deposition, sputtering or the like for providing electrodes is not crystallographically oriented in a constant direction but remains in an amorphous polycrystalline state. This is regarded as the cause for stressmigration due to intercrystalline diffusion in such aluminum electrodes.

Accordingly, an object of the present invention is to provide a surface acoustic wave device comprising aluminum electrodes, which have very little stressmigration and can be formed by application of photolithography with no problem.

The present invention is directed to a surface acoustic wave device which comprises a single-crystalline dielectric member, a piezoelectric thin film epitaxially grown thereon and electrodes defining a transducer, for example. The inventive surface acoustic wave device is characterized in that the electrodes are formed along the interface between the dielectric member and the piezoelectric thin film and include an aluminum film which is crystallographically oriented in a constant direction.

According to the present invention, the aluminum electrodes are so crystallographically oriented in a constant direction, i.e., epitaxially grown, that the piezoelectric thin film can be further epitaxially grown both the single-crystalline dielectric member and on such aluminum electrodes formed on the single-crystalline dielectric member.

Thus, the aluminum electrodes are directly formed on the surface of the single-crystalline dielectric member, and hence an aluminum film for providing the aluminum electrodes can be smoothed by specularly polishing the surface of the single-crystalline dielectric member. Therefore, the aforementioned problem in photolithography caused in formation of the aluminum film on the piezoelectric thin film is effectively solved and avoids the disadvantages such as short-circuiting across the thus formed electrodes.

Further, an aluminum film whose crystal axes are oriented in a constant direction is considered to exhibit properties which are close to those of a single-crystalline film. Thus, such an aluminum film hardly had any stressmigration. According to the present invention, therefore, it is possible to prevent electrical shorting and increase in insertion loss caused by stressmigration. When the present invention is applied to a resonator, its quality factor can be prevented from reduction caused by stressmigration.

In general, stressmigration is increased as the frequency is increased. However, the occurrence of such stressmigration can be suppressed according to the present invention, whereby the surface acoustic wave device can have good high-frequency characteristics while the features of the high SAW velocity substrate can be sufficiently effectuated.

According to the present invention, further, it is also possible to suppress occurrence of stressmigration upon application of a signal of a high voltage level. Thus, the inventive surface acoustic wave device is practically applicable to a circuit, such as a transmission filter, for example, having a high signal level.

According to the present invention, the single-crystalline dielectric member is preferably prepared from silicon, sapphire, diamond or quartz crystal. The piezoelectric thin film is preferably prepared from zinc oxide or aluminum nitride.

In a typical embodiment of the present invention, the single-crystalline dielectric member is prepared from sapphire, the piezoelectric thin film is prepared from zinc oxide and the aluminum film is prepared from a (311) plane oriented film.

It is possible to further effectively suppress stressmigration by adding a small amount of an admixture such as Cu, Ti, Ni, Mg or Pd to the aluminum film. The amount of such an admixture is preferably selected within a range of 0.1 to 10 percent by weight.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
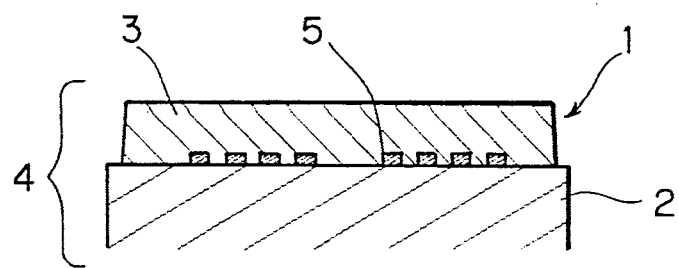
FIG. 1 is a sectional view showing a surface acoustic wave device according to an embodiment of the present invention.

Referring to FIG. 1, a surface acoustic wave device 1 comprises a substrate 4, which is formed by a single-crystalline dielectric member 2 and a piezoelectric thin film 3 epitaxially grown on its surface. The single-crystalline dielectric member 2 is prepared from R-plane sapphire, for example. The piezoelectric thin film 3 is formed by a (1120) plane oriented thin film of ZnO, for example.

Aluminum electrodes 5 for serving as interdigital electrodes are formed along the interface between the single-crystalline dielectric member 2 and the piezoelectric thin film 3. The aluminum electrodes 5 define a transducer, for example.

An experimental sample of the surface acoustic wave device 1 shown in FIG. 1 will now described in detail along with manufacturing steps for manufacturing it.

First, an R-plane sapphire plate having a specularly polished surface was prepared for forming the single-crystalline dielectric member 2, and a thin aluminum film for providing the aluminum electrodes 5 was formed on its surface by vapor deposition. It was possible to epitaxially grow the aluminum film on the R-plane sapphire plate by controlling deposition conditions. The thickness of the thus formed aluminum film was 500 Å.

The aluminum film thus formed on the R-plane sapphire plate was analyzed through RHEED (reflection high-energy electron diffraction).

Figure 3:
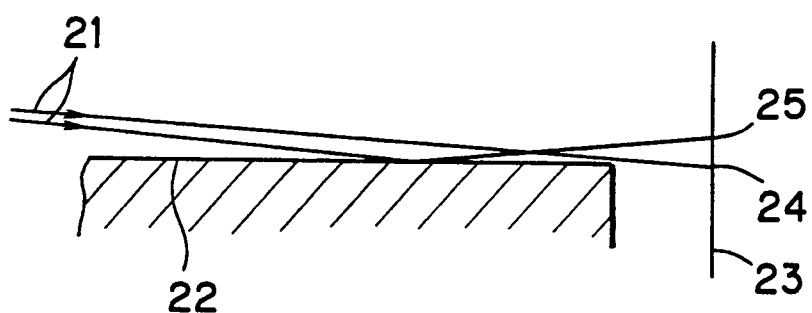
FIG. 3 is a diagram for illustrating a method for obtaining the photograph shown in FIG. 2A.

As shown in FIG. 3, RHEED was carried out by applying a high-energy electron beam 21 onto a surface 22 of the sample at an extremely small angle of incidence, to analyze the crystal structure of the surface 22 and a portion close thereto from the status of the reflection. A direct spot 24 of the electron beam 21 and an RHEED image (reflected diffraction pattern) 25 resulting from the electron beam 21, which was reflected by the surface 22 of the sample, appeared on a photosensitive film 23 for recording.

In such RHEED, a spot-type RHEED image generally appears if the surface of a sample has a periodic crystal structure. On the other hand, a ring-shaped RHEED image appears when the surface of the sample has a polycrystalline structure, while a halo-shaped RHEED image appears when the sample surface has an amorphous structure.

Figure 2A:
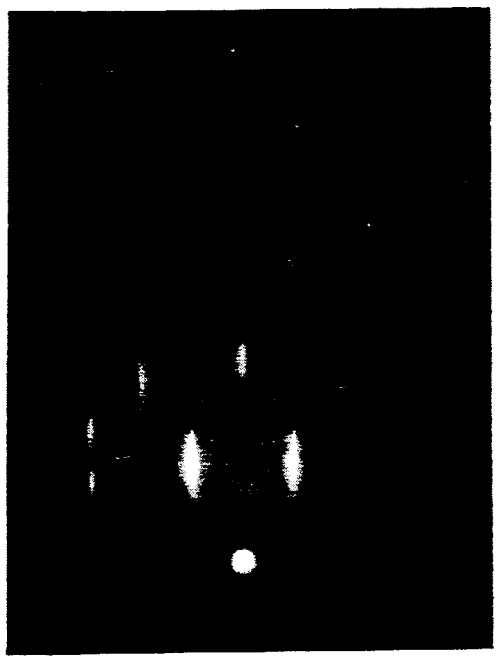
FIG. 2A shows a photograph of an aluminum film according to the embodiment of the present invention taken through reflection high-energy electron diffraction (RHEED)
Figure 2B:
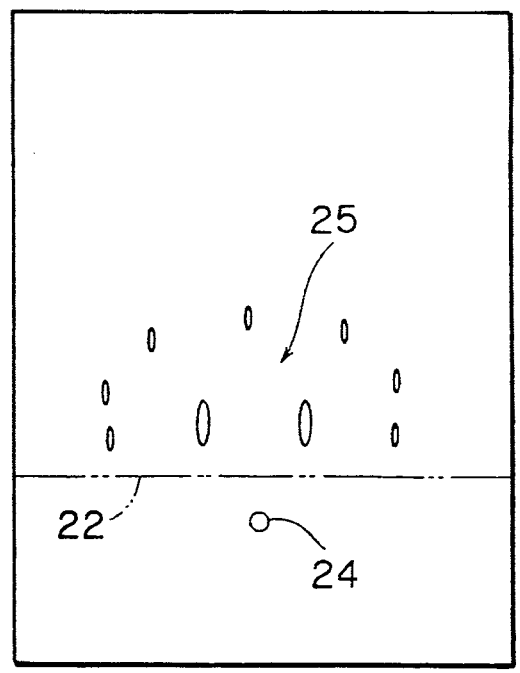
FIG. 2B is an explanatory diagram corresponding to FIG. 2A.

FIG. 2A shows a photograph of the aluminum film, which was formed on the R-plane sapphire plate in the aforementioned manner, taken through RHEED, and FIG. 2B is an explanatory diagram for the photograph shown in FIG. 2A. The wavelength of the electron beam 21 was 0.0251 Å.

Referring to FIG. 2B, the direct spot 24 of the electron beam 21 appears on a lower portion of the surface 22 of the sample (aluminum film), and the RHEED image 25 appears on an upper portion of the surface 22. As shown in FIGS. 2A and 2B, some spots appear in the RHEED image 25, to prove that the as-formed aluminum film was epitaxially grown.

The surface of the R-plane sapphire plate ($\alpha$-$Al_2O_3$) was a (0112) plane and surface waves were propagated in a [0111] direction on this (0112) plane, while it has been recognized by RHEED analysis that the aluminum film was epitaxially grown on a (311) plane and surface waves were propagated in a [1011] direction on the (311) oriented plane.

Then the aluminum film was photoetched thereby forming interdigital aluminum electrodes 5 whose electrode fingers had widths and spaces of 1 $\mu$m on the surface of the R-plane sapphire plate.

Then, a ZnO film for defining the piezoelectric thin film 3 was epitaxially grown by planar magnetron sputtering on the surface, including the aluminum electrodes 5, of the single-crystalline dielectric member 2 of the R-plane sapphire plate, as shown in FIG. 1.

Thus, the surface acoustic wave device 1 was obtained. In this surface acoustic wave device 1, the aluminum electrodes 5 were the so-called split electrodes, and the wavelength of surface acoustic waves was 8 μm. In order to use Sezawa wave, a kind of SAW, propagated on the substrate 4 formed of the ZnO film/R-plane sapphire plate, the thickness of the ZnO film 3 was made 0.25 times the wavelength of the Sezawa wave having a relatively large electromechanical coupling factor, i.e., 2 μm.

According to this surface acoustic wave device 1, the aluminum film for defining the aluminum electrodes 5 was formed on the surface of the single-crystalline dielectric member 2 made of the sapphire plate whose surface was specularly polished, whereby it was possible to smooth the aluminum film in order to prevent occurrence of a failure caused by a defect possibly resulting from photolithography.

Figure 4:
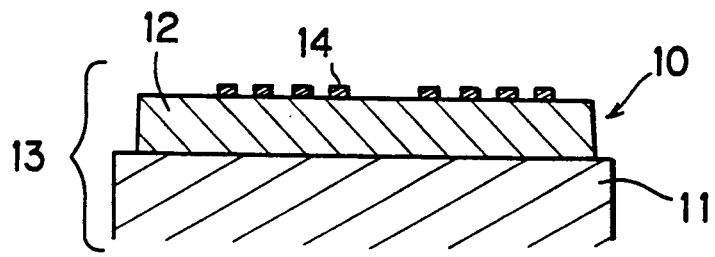
FIG. 4 is a sectional view showing a conventional surface acoustic wave device.

In the conventional structure shown in FIG. 4, on the other hand, the aluminum film for defining the aluminum electrodes 14 is formed on the ZnO film 12 which is epitaxially grown on the R-plane sapphire plate, and photolithography is applied to this aluminum film. Therefore, projections formed on the ZnO film 12 exert such a bad influence on the aluminum film that aluminum electrodes 14 experimentally obtained by photoetching were short-circuited in about 30% of the samples of the conventional surface acoustic wave device.

Figure 5:
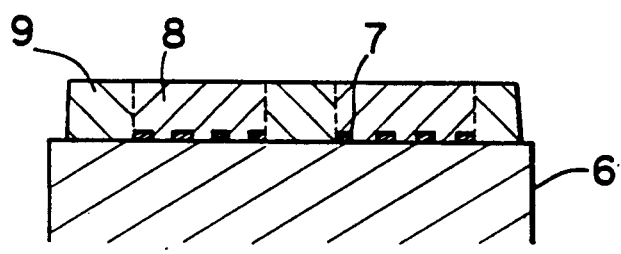
FIG. 5 is a sectional view showing a surface acoustic wave device according to a reference example, which is of interest to the present invention.

FIG. 5 shows a surface acoustic wave device according to a reference example, which is of interest to the present invention. If aluminum electrodes 7 formed on an R-plane sapphire plate 6 are random-oriented polycrystalline aluminum films, a ZnO film 9 cannot be epitaxially grown but remains in a polycrystalline state in regions 8 above the aluminum electrodes 7. In an experimental sample of such reference example, therefore, propagation loss was increased to at least 10 times as compared with the aforementioned embodiment.

According to the aforementioned embodiment of the present invention, the aluminum electrodes 5 are provided by the epitaxially grown aluminum film, whereby it is possible to suppress occurrence of stressmigration caused by intercrystalline diffusion.

It has been confirmed that stressmigration can be further effectively suppressed by adding an admixture such as Cu, Ti, Ni, Mg or Pd to the aluminum film for defining the aluminum electrodes. In general, the amount of such an admixture must be at least 0.1 percent by weight since no substantial effect is attained if the amount is too small, and is preferably not more than 10 percent by weight since the resistivity of the aluminum film is increased if the amount is too large.

According to the aforementioned embodiment of the present invention, the aluminum electrodes 5, which are formed along the interface between the single-crystalline dielectric member 2 and the piezoelectric thin film 3, are not exposed to the exterior and can be prevented from oxidation.

Although the present invention has been described and illustrated in detail, it is clearly understood that the same is by way of illustration and example only and is not to be taken by way of limitation, the scope of the present invention being limited only by the terms of the appended claims.

What is claimed is:

1. A surface acoustic wave device comprising:
   a substrate comprising a single-crystalline dielectric member having a surface and a piezoelectric thin film epitaxially grown on said surface of said dielectric member; and
   electrode means formed along the interface between said dielectric member and said piezoelectric thin film, said electrode means including an aluminum film being crystallographically oriented in a constant direction.

2. A surface acoustic wave device in accordance with claim 1, wherein said single-crystalline dielectric member is formed of an element selected from the group consisting of silicon, sapphire, diamond and quartz crystal, and said piezoelectric thin film is formed of a material selected from the group consisting of zinc oxide and aluminum nitride.

3. A surface acoustic wave device comprising:
   a substrate comprising a single-crystalline dielectric member having a surface and a piezoelectric thin film epitaxially grown on said surface of aid dielectric member; and
   electrode means formed along the interface between said dielectric member and said piezoelectric thin film, said electrode means including an aluminum film being crystallographically oriented in a constant direction;
   wherein aid single-crystalline dielectric member is formed of sapphire, said piezoelectric thin film is formed of zinc oxide, and said aluminum film is a (311) plane oriented film.

4. A surface acoustic wave device in accordance with claim 1, claim 2 or claim 3 wherein said aluminum film contains an admixture formed of at least one element selected from the group consisting of Cu, Ti, Ni, Mg and Pd.

5. A surface acoustic wave device in accordance with claim 4, wherein said aluminum film contains 0.1 to 10 percent by weight of said admixture.

6. A surface acoustic wave device comprising:
   a substrate comprising a single-crystalline dielectric member having a surface and a piezoelectric thin film epitaxially grown on said surface of said dielectric member; and
   electrode means formed along the interface between said dielectric member and said piezoelectric thin film, said electrode means including an aluminum film being crystallographically oriented in a constant direction, said single-crystalline dielectric member being formed of an element selected from the group consisting of silicon, sapphire, diamond and quartz crystal, said piezoelectric thin film being formed of a material selected from the group consisting of zinc oxide and aluminum nitride, and said aluminum film being formed of a (311) plane oriented film.

* * * * *